(12) United States Patent
Wan et al.

(10) Patent No.: US 12,176,466 B2
(45) Date of Patent: Dec. 24, 2024

(54) LED DEVICE AND BRACKET THEREOF

(71) Applicant: APT ELECTRONICS CO., LTD., Guangdong (CN)

(72) Inventors: Chuiming Wan, Guangdong (CN); Zhaoming Zeng, Guangdong (CN); Yian Lan, Guangdong (CN); Linshan Li, Guangdong (CN); Wenmin Zhu, Guangdong (CN); Guowei David Xiao, Guangdong (CN)

(73) Assignee: APT ELECTRONICS CO., LTD., Guangdong (CN)

( * ) Notice: Subject to any disclaimer, the term of this patent is extended or adjusted under 35 U.S.C. 154(b) by 418 days.

(21) Appl. No.: 17/763,706

(22) PCT Filed: Oct. 21, 2019

(86) PCT No.: PCT/CN2019/112239
§ 371 (c)(1),
(2) Date: Mar. 25, 2022

(87) PCT Pub. No.: WO2021/056643
PCT Pub. Date: Apr. 1, 2021

(65) Prior Publication Data
US 2022/0344546 A1    Oct. 27, 2022

(30) Foreign Application Priority Data
Sep. 25, 2019   (CN) .......................... 201910911565.8

(51) Int. Cl.
*H01L 33/62*   (2010.01)
*H01L 25/075*  (2006.01)
(Continued)

(52) U.S. Cl.
CPC ........ *H01L 33/483* (2013.01); *H01L 25/0753* (2013.01); *H01L 33/60* (2013.01); *H01L 33/62* (2013.01)

(58) Field of Classification Search
CPC ......... H01L 2933/00–0091; H01L 33/00–648; H01L 25/048; H01L 27/14–14893;
(Continued)

(56) References Cited

U.S. PATENT DOCUMENTS

2010/0270571 A1* 10/2010 Seo ................... H01L 23/49541
                                                        257/E33.059
2017/0084800 A1   3/2017 Hung et al.
2019/0157531 A1*  5/2019 Moon ..................... H01L 33/62

FOREIGN PATENT DOCUMENTS

CN          203055907 U       7/2013
CN          208478377 U       2/2019
(Continued)

OTHER PUBLICATIONS

International Search Report issued by the China National Intellectual Property Administration acting as the International Searching Authority in relation to International Application No. PCT/CN2019/112239 dated Jun. 24, 2020 (5 pages) along with English language translation (3 pages).
(Continued)

*Primary Examiner* — Moin M Rahman
(74) *Attorney, Agent, or Firm* — Robert P. Michal, Esq.; Carter, DeLuca & Farrell LLP (57) ABSTRACT

An LED device and a bracket thereof. The bracket includes a first photo-etched metal part, composed of a first electrode and a chip placement layer stacked thereon, wherein an area of the chip placement layer is greater than an area of the first electrode; a second photo-etched metal part, composed of a second electrode and a connection layer stacked thereon; wherein a first insulation trench is provided between the first
(Continued)

electrode and the second electrode, and a second insulation trench is provided between the chip placement layer and the connection layer. The LED device and the bracket thereof can increase the placement area for placing LED chips, thereby improving the luminance of the LED device.

16 Claims, 8 Drawing Sheets

(51) Int. Cl.
  *H01L 33/48* (2010.01)
  *H01L 33/60* (2010.01)
(58) Field of Classification Search
  CPC . H01L 31/145–153; H01L 31/165–173; H01L 25/075–0756; H01L 25/13; H01L 25/16–167; H01L 25/18; H01L 33/52–56; H01L 51/448; H01L 51/5209; H01L 27/3262; H01L 27/3258; H01L 27/3248; H01L 27/322; H01L 51/5225; H01L 51/5268; H01L 2251/558; H01L 2251/303; H01L 2251/306; H01L 2251/308; H01L 51/5218; H01L 51/5271; H01L 51/5275; H01L 51/0005; H01L 51/5012; H01L 51/5206; H01L 51/5221; H01L 51/56; H01L 27/3244; H01L 2227/323; H01L 33/382; H01L 33/387; H01L 33/504; H01L 33/507; H01L 25/0753; H01L 33/62; H01L 2224/48091; H01L 2224/48137; H01L 33/647; H01L 33/486; H01L 2224/45144; H01L 33/54; H01L 33/641; H01L 33/60; H01L 27/30; H01L 27/3239; H01L 31/143; H01L 31/162; H01L 33/08; H01L 33/18; H01L 33/24; H01L 51/5032; H01L 27/288; H01L 27/32; H01L 33/06; H01L 33/26; H01L 51/0032; H01L 51/50; H01L 2251/50; H01L 51/5068; H01L 51/5084; H01L 51/5296; H01L 2051/0032; H01L 2227/32; H01L 2933/0033; H01L 2933/0066; H01L 33/50; H01L 33/20; H01L 51/00; H01L 33/58; H01L 27/1248; H01L 33/505; H01L 29/78633; H01L 51/5262
  See application file for complete search history.

(56) References Cited

FOREIGN PATENT DOCUMENTS

| CN | 208923187 U | 5/2019 |
|----|-------------|--------|
| CN | 109887906 A | 6/2019 |
| CN | 109952660 A | 6/2019 |
| CN | 110649145 A | 1/2020 |
| CN | 210692587 U | 6/2020 |
| CN | 210692588 U | 6/2020 |

OTHER PUBLICATIONS

Written Opinion of the International Searching Authority issued by the China National Intellectual Property Administration acting as the International Searching Authority in relation to International Application No. PCT/CN2019/112239 dated Jun. 24, 2020 (5 pages).

* cited by examiner

LED DEVICE AND BRACKET THEREOF

CROSS-REFERENCE TO RELATED APPLICATIONS

This application claims priority to PCT Application No. PCT/CN2019/112239, having a filing date of Oct. 21, 2019 based on Chinese application No. 201910911565.8 having a filing date of Sep. 25, 2019, the entire contents of foresaid documents are hereby incorporated by reference.

TECHNICAL FIELD

The following relates to the field of LED technology, and particularly to an LED device and a bracket thereof.

BACKGROUND

Figure 1:
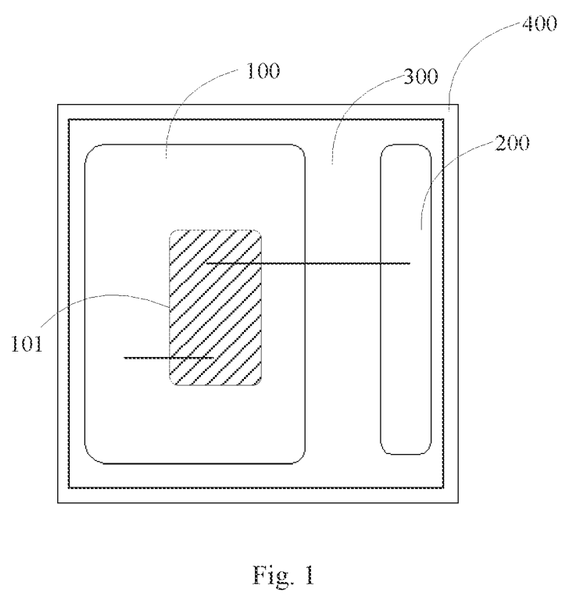
FIG. 1 is a structural schematic diagram of a packaging bracket provided with an LED chip in the prior art.

In the current field of LED, a bracket for packaging an LED chip is generally comprised of a photo-etched part and a reflector cup. As shown in FIG. 1, the photo-etched part is usually etched into a first electrode 100 and a second electrode 200, which are separated from each other. The first electrode 100 and the second electrode 200 are both in a flat plate-like shape, and the surface area of the first electrode 100 is greater than that of the second electrode 200. The first electrode 100 is utilized to fix an LED chip 101 and is connected to a first end of the LED chip 101, while the second electrode 200 is connected to a second end of the LED chip 101. The reflector cup 400 is molded on the photo-etched part with resin materials by an injection molding machine.

To prevent an LED device employing such bracket from short-circuiting when connected externally, an insulation trench 300, located between the first electrode 100 and the second electrode 200 in the bracket, is generally designed to have a large width. Since the insulation trench 300 occupies a certain area of the bracket, the area of the placement zone for placing the LED chip on the first electrode 100 is relatively small and only one LED chip with a smaller light-emitting area can be accommodated, resulting in a low luminance of the LED device.

SUMMARY

An aspect relates to an LED device and a bracket thereof, which will increase the placement areas for placing LED chips, and thus improve the luminance of the LED device.

To solve the above technical problem, a bracket of the present disclosure includes a first photo-etched metal part, composed of a first electrode and a chip placement layer stacked thereon, wherein an area of the chip placement layer is greater than that of the first electrode; a second photo-etched metal part, composed of a second electrode and a connection layer stacked thereon; wherein a first insulation trench is provided between the first electrode and the second electrode, and a second insulation trench is provided between the chip placement layer and the connection layer.

In an improved embodiment, the chip placement layer includes a first placement zone and a second placement zone connected to each other, wherein the first placement zone has a greater length than that of the second placement zone; a first end of the first placement zone is arranged flush with a first end of the second placement zone so as to become a first edge of the chip placement layer; a second end of the first placement zone and a second end of the second placement zone together become a second edge of said chip placement layer; and the chip placement layer has a greater length and a greater width than those of the first electrode; a profile of a first edge of the connection layer is matched with a profile of the second edge of the chip placement layer.

In an improved embodiment, the second insulation trench is filled with a first white light-reflecting layer; a first receiving section is provided at the second end of the first placement zone and a second receiving section is provided at the second end of the second placement zone; the first receiving section and the second receiving section are incorporated in an unaligned manner to jointly form a chip receiving zone; and a reflective wall is provided around the chip receiving zone along the whole periphery, except an edge next to the second insulation trench; and the reflective wall is connected to the first white light-reflecting layer in the second insulation trench to form a first reflector cup.

In an improved embodiment, a first groove is provided around two parallel edges of the chip receiving zone and an edge thereof remote from the second insulation trench, and is filled with a first white light-reflecting layer to form the reflective wall.

In an improved embodiment, the first receiving section includes a first protruding part, which is provided at one end of the first receiving section adjacent to the second insulation trench; and the second receiving section includes a second protruding part, provided at one end of the second receiving section remote from the second insulation trench.

In an improved embodiment, a second reflector cup is provided around the first photo-etched metal part and the second photo-etched metal part and is located outside of the first reflector cup; and a second groove is formed between the first reflector cup and the second reflector cup for filling with a second white light-reflecting layer.

In an improved embodiment, a top of the first reflector cup is square, semi-circle, or dome-shaped, and there is a height difference of 60 μm~120 μm between the top of the first reflector cup and a top of the first photo-etched metal part.

In an improved embodiment, the second end of the first placement zone is smoothly connected to the second end of the second placement zone at a corner.

In an improved embodiment, the connection layer at its first edge is provided with a third protruding part matched with the second edge of the chip placement layer, so that a Zener diode is placed at an end of the connection layer.

In an improved embodiment, the chip placement layer further includes a Zener connection layer, which is provided between the first reflector cup and the second reflector cup and is close to the third protruding part. Provided is also an LED device, the device includes two LED chips and any a bracket mentioned above, wherein the two LED chips are arranged in the first placement zone and the second placement zone, respectively.

Another aspect relates to an LED device, the device includes two LED chips and any an above-mentioned bracket having a first reflector cup and a second reflector cup; the two LED chips are arranged in the first receiving section and the second receiving section, respectively; a second white light-reflecting layer is filled in a second groove; a fluorescent layer is coated on an inner side of the first reflector cup and on the second white light-reflecting layer.

Compared to the prior art, the LED device and the bracket thereof according to the present disclosure are implemented with the following advantageous effects: it is noted that the first electrode and the chip placement layer are stacked thereon in the first photo-etched metal part, the area of the chip placement layer is greater than that of the first electrode, and the second electrode and the connection layer are stacked thereon in the second photo-etched metal part. Thus, on the one hand, the chip placement layer of the bracket is designed to have a larger area by reducing the area of the second insulation trench between the chip placement layer and the connection layer, so that the bracket may accommodate an LED chip with a larger light-emitting area so as to improve the luminance of an LED device employing such bracket. On the other hand, since the first insulation trench of the bracket between the first electrode and the second electrode is configured to be identical in width and area to those in the prior art, the bracket can be prevented from short-circuiting when connected externally, and the bracket can also be compatible with the electrodes of the existing bracket.

BRIEF DESCRIPTION OF THE DRAWINGS

FIG. 6 (6a, 6b) is a structural schematic diagram of an LED device in an embodiments of the present disclosure.

FIG. 7 (7a, 7b) is a structural schematic diagram of another LED device in an embodiments of the present disclosure.

FIG. 8 (8a, 8b) is a structural schematic diagram of yet another LED device in an embodiments of the present disclosure.

DETAILED DESCRIPTION OF EMBODIMENTS

In the following description, numerous specific details are set forth to facilitate a thorough understanding of the present disclosure. However, the present disclosure can be implemented in many other ways than the one described herein, and those skilled in the art may make similar extensions without departing from the spirit and scope of the present disclosure. Accordingly, the present disclosure is not intended to be limited to the specific embodiments disclosed below.

The present disclosure will be clearly and fully described hereinafter with reference to embodiments and the accompanying drawings.

Figure 2:
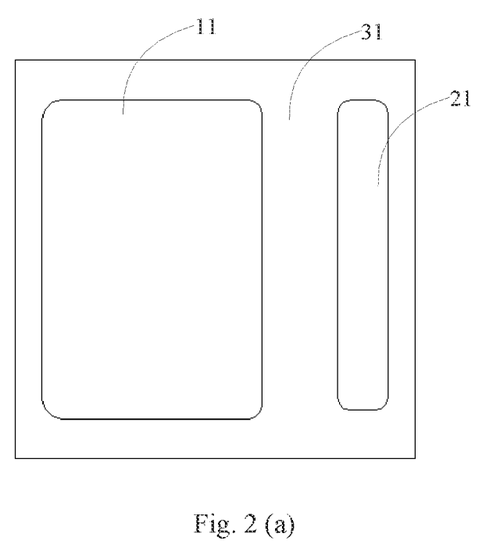
FIG. 2(a) is a structural schematic diagram of a bracket in an embodiment of the present disclosure in a bottom view.
FIG. 2(b) is a structural schematic diagram of a bracket in an embodiment of the present disclosure in a top view.

FIG. 2 is a structural schematic diagram of a bracket provided in an embodiment of the present disclosure.

As shown in FIGS. 2(a) and 2(b), the bracket includes a first photo-etched metal part, composed of a first electrode 11 and a chip placement layer 12 stacked thereon, wherein an area of the chip placement layer 12 is greater than that of the first electrode 11; a second photo-etched metal part, composed of a second electrode 21 and a connection layer 22 stacked thereon; wherein a first insulation trench 31 is provided between the first electrode 11 and the second electrode 21, while a second insulation trench 32 is provided between the chip placement layer 12 and the connection layer 22.

In the bracket of the present embodiment, it is noted that the first electrode 11 and the chip placement layer 12 are stacked thereon in the first photo-etched metal part, the area of the chip placement layer 12 is greater than that of the first electrode 11, and the second electrode 21 and the connection layer 22 are stacked thereon in the second photo-etched metal part. Thus, on one hand, the chip placement layer 12 of the bracket is configured to have a larger area by reducing the area of the second insulation trench 32 between the chip placement layer 12 and the connection layer 22, so that the bracket can accommodate an LED chip with a larger light-emitting area so as to improve the luminance of an LED device employing such bracket. On the other hand, since the first insulation trench 31 of the bracket between the first electrode 11 and the second electrode 21 is configured to be identical in width and area to those in the prior art, the bracket can be prevented from short-circuiting when connected externally, and the bracket can also be compatible with the electrodes of the existing bracket.

Optionally, the first electrode 11 and the second electrode 12 may both be rectangular and be identical in size to the bracket in the prior art, thereby being compatible with the packaging structure of the existing LED device.

In one possible embodiment, as shown in FIG. 2 (b), the chip placement layer 12 includes a first placement zone 121 and a second placement zone 122 connected to each other, wherein the first placement zone 121 has a greater length than that of the second placement zone 122; a first end 121A of the first placement zone 121 is arranged flush with a first end 122A of the second placement zone 122 so as to become a first edge 12A of the chip placement layer 12; a second end 121B of the first placement zone 121 and a second end 122B of the second placement zone 122 together become a second edge 12B of the chip placement layer 12; and the chip placement layer 12 has a greater length and a greater width than those of the first electrode 11. In this manner, the area of the chip placement layer 12 can be effectively increased and the second end 121B of the first placement zone 121 and the second end 122B of the second placement zone 122 are unaligned to place two LED chips, thereby increasing the utilization rate of the chip placement layer 12. In addition, a profile of a first edge 22A of the connection layer 22 is matched with a profile of the second edge 12B of the chip placement layer 12, so that the connection layer 22 is designed to have a protruding part at which wire bonding are performed and Zener diodes are placed.

Optionally, as shown in FIG. 2(b), the first placement zone 121 and the second placement zone 122 as a whole may be rectangular, and protrude at the upper portion of this figure, and the connecting layer 22 may integrally be rectangular and protrude at the lower portion of the figure. Thus the first placement zone 121 is matched with the connecting layer 22 at its upper portion, while the second placement zone 122 is matched with the connecting layer 22 at its lower portion, thereby improving the space utilization rate.

Figure 3:
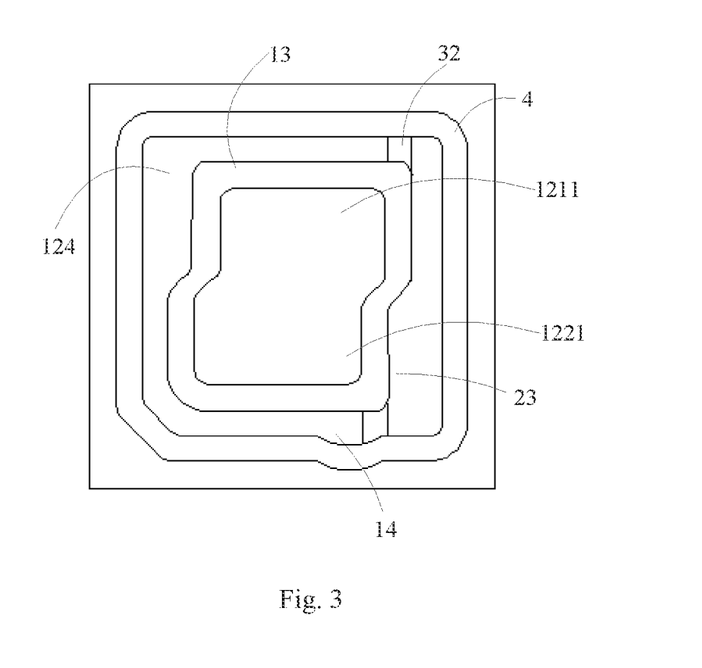
FIG. 3 is a structural schematic diagram of another bracket in an embodiment of the present disclosure in a top view.

FIG. 3 is a structural schematic diagram of another bracket in an embodiment of the present disclosure.

As shown in FIG. 3, in this embodiment, in addition to all the structures described above, the second insulation trench 32 is filled with a first white light-reflecting layer; a first receiving section 1211 is provided at the second end 121B of the first placement zone 121 and a second receiving section 1221 is provided at the second end 122B of the second placement zone 122. Thus the first receiving section 1211 and the second receiving section 1221 are incorporated in an unaligned manner to jointly form a chip receiving zone. A reflective wall 13 is provided around the chip receiving zone along the whole periphery, except the edge next to the second insulation trench 32. The reflective wall 13 is connected to the first white light-reflecting layer in the second insulation trench 32 to form a first reflector cup.

In this embodiment, since the first receiving section 1211 is provided at the second end 121B of the first placement zone 121 while the second receiving section 1221 is provided at the second end 122B of the second placement zone 122, and the first receiving section 1211 and the second receiving section 1221 are further arranged at the junction of the first placement zone 121 and the second placement zone 122, the first receiving section 1211 and the second receiving section 1221 are incorporated in an unaligned manner to jointly form a chip receiving zone. Thus the chip receiving zone is facilitated to receive two unaligned LED chips, which may be adjacent to each other, thereby improving the utilization rate of the chip placement layer 12. In this way, there is enough space spared to provide the reflective wall 13 around the chip receiving zone along the whole periphery, except the edge next to the second insulation trench 32. The reflective wall 13 is connected to the first white light-reflecting layer in the second insulation trench 32 to form the first reflector cup, which can reflect the light emitted by the LED chips. Thus the luminous intensity and luminous efficiency of the LED device employing this bracket are further improved.

Preferably, in the above embodiment, the second end 121B of the first placement zone 121 is smoothly connected to the second end 122B of the second placement zone 122 at the corner 123. Thus the first white light-reflecting layer is uniformly filled in the second insulation trench 32, thereby improving the consistency of the luminous intensity and luminous efficiency of the LED device.

In one possible embodiment, as shown in FIGS. 3, 4(a)-4(e), the first receiving section 1211 and the second receiving section 1221 may be rectangular and are incorporated in an unaligned manner, wherein the first receiving section 1211 and the second receiving section 1221 each accommodate one LED chip. Thus, the reflective wall 13 may be formed by a continuous first groove 131 which is provided around the chip receiving zone along the periphery consisting of the two parallel edges and the one remote from the second insulation trench 32, and is filled with the first white light-reflecting layer 132. Both ends of the reflecting wall 13 are connected to the first white light-reflecting layer 132 filled in the second insulation trench 32 to form a first reflector cup.

In this embodiment, the first receiving section 1211 are in smooth connection with the second receiving section 1221 at their both ends to form two smooth bends at the edges of the chip receiving zone formed by the first receiving section 1211 and the second receiving section 1221, so that the first white light-reflecting layer 132 can be uniformly filled in the reflective wall 13. In this way, the utilization rate of the chip placement layer in the bracket is improved. In addition, not only the placement area of the LED chip is increased, but also there is still some space spared to form the first reflector cup with a uniform wall thickness, thereby improving the consistency of the luminous intensity and luminous efficiency of the LED device.

Figure 4:
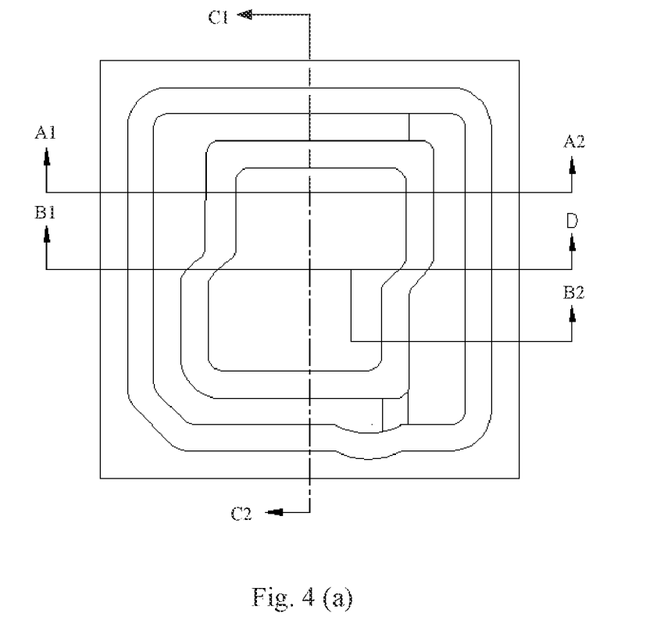
FIG. 4(a) is a schematic diagram of the bracket shown in FIG. 3, showing the section lines A1-A2, B1-B2, B1-D, and C1-C2.
FIG. 4(b) is a sectional view of the bracket shown in FIG. 3 along the section line B1-B2.
FIG. 4(c) is a sectional view of the bracket shown in FIG. 3 along the section line A1-A2.
FIG. 4(d) is a sectional view of the bracket shown in FIG. 3 along the section line B1-D.
FIG. 4(e) is a sectional view of the bracket shown in FIG. 3 along the section line C1-C2.

Preferably, as shown in FIGS. 3 and 4, in an embodiment of the present disclosure, a second reflector cup 4 is provided around the first photo-etched metal part and the second photo-etched metal part, and is located outside of the first reflector cup. A second groove 5 is formed between the first reflector cup and the second reflector cup 4 for filling with a second white light-reflecting layer. In this way, the light reflection efficiency of the LED device employing the bracket can be further enhanced and its luminance can also be improved.

Preferably, a top of the first reflector cup is square, semi-circle, or dome-shaped, and there is a height difference of 60 μm~120 μm between the top of the first reflector cup and the top of the first photo-etched metal part.

Figure 5:
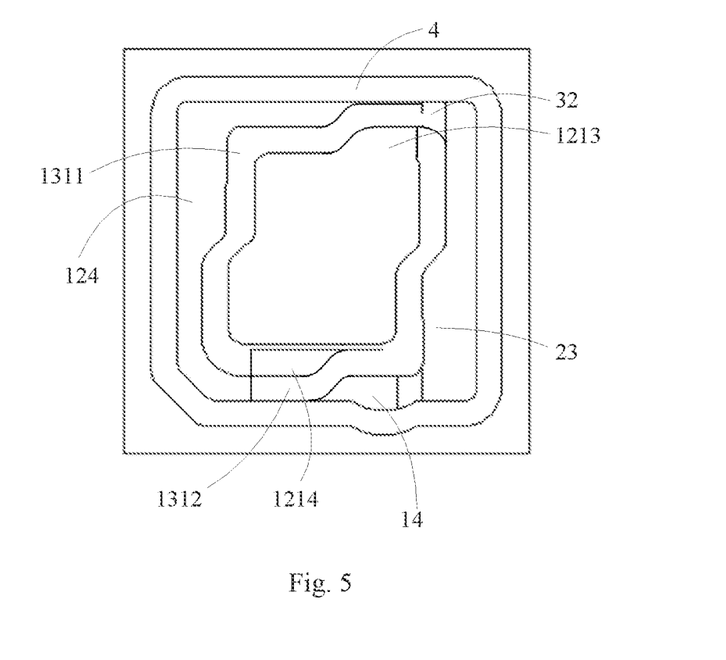
FIG. 5 is a structural schematic diagram of yet another bracket in an embodiment of the present disclosure in a top view.

In addition, as shown in FIG. 5, in another possible embodiment, the first receiving section 1211 may further include a first protruding part 1213, provided at one end of the first receiving section 1211 adjacent to the second insulation trench 32; the second receiving section 1221 may include a second protruding part 1214, provided at an end of the second receiving section 1221 remote from the second insulation trench 32. Thus, the reflective wall 13 may include a first reflective wall 1311 and a second reflective wall 1312; wherein the first reflective wall 1311 surrounds the first protruding part 1213, the parallel edge of the first receiving section 1211, as well as the corresponding edges of the first receiving section 1211 and the second receiving section 1221 away from the second insulation trench 32; wherein the second reflective wall 1312 surrounds the second protruding part 1214 and the parallel edge of the second receiving section 1221. The first reflective wall 1311 and the second reflective wall 1312 are both connected to the white light-reflecting layer in the second insulation trench 32 at their own first end; and meanwhile the first reflective wall 1311 and the second reflective wall 1312 are interconnected at their second ends but unaligned. And an outer corner of the first reflective wall 1311 at its second end is connected to an inner corner of the second reflective wall 1312 at its second end. Thus, the first reflective wall 1311 and the second reflective wall 1312, together with the first light-reflecting layers filled in the second insulation trench 32 form into a first reflector cup.

Preferably, in the above-mentioned embodiment, the connection layer 22 at its first edge 22A is provided with a third protruding part 23, which is matched with the second edge 12B of the chip placement layer 12. Thus, at the end of the connection layer 22, wire bonding can be performed and Zener diodes can be placed. Further, the chip placement layer 12 includes a Zener connection layer 14, which is provided between the first reflector cup and the second reflector cup 4 and close to the third protruding part 23. Since the area of the chip placement layer 12 in the first photo-etched metal part is increased by reducing the area of the second insulation trench 32, a sufficient spare space for the wire bonding of the Zener diode may be obtained by providing the Zener connection layer 14. In addition, the Zener connection layer 14 is close to the third protruding part 23, which is facilitated to perform wire bonding and shortens the distance of wire bonding.

Preferably, in this embodiment, the chip placement layer 12 further includes a fourth protruding part 124, which is provided between the first reflector cup and the second reflector cup 4, and is close to the first receiving section 1211. Thus a sufficient space for the wire bonding is spared.

Preferably, in the embodiment described above, the height of the first reflector cup is smaller than the one of the second reflector cup 4, which may prevent the first reflector cup from blocking the light emitted from the LED chips arranged in the first placement zone 121 and the second placement zone 122.

Preferably, in the above-described embodiment, the material of the first white light-reflecting layer 132 may be white EMC (Epoxy molding compound) resin, thereby improving the light-reflecting efficiency of the LED device employing the bracket, as well as the luminance.

Figure 6:
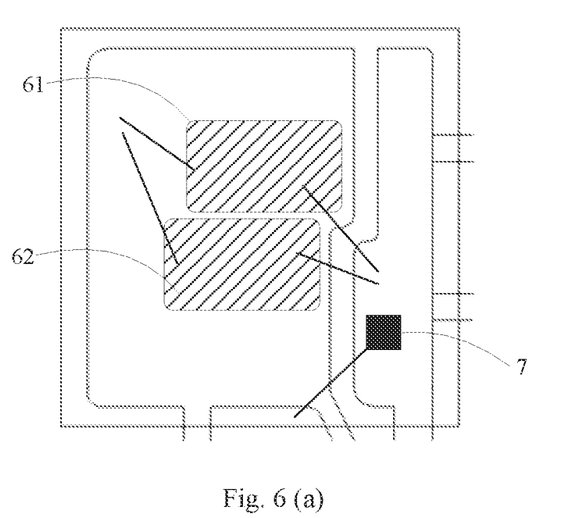
Figure 7:
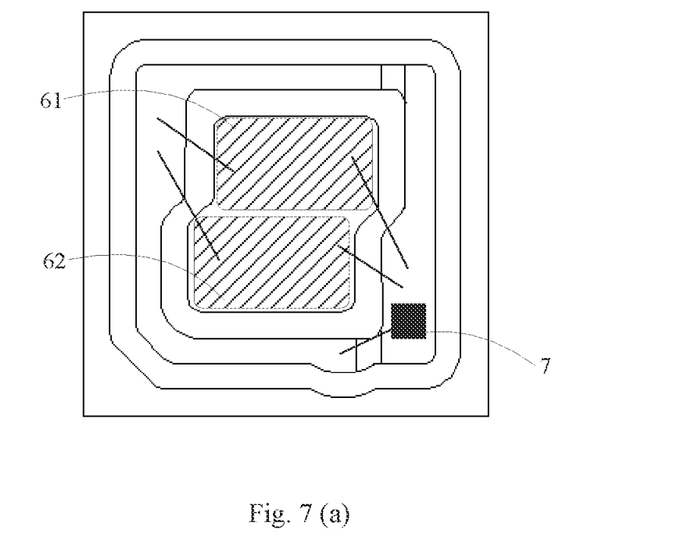
Figure 8:
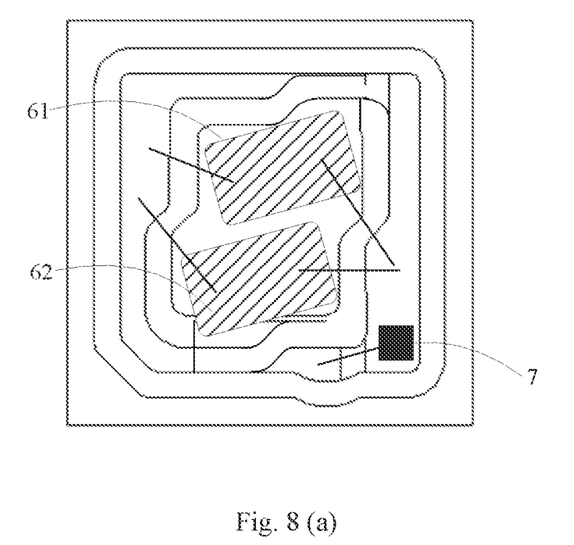

FIGS. 6-8 are structural schematic diagrams of an LED device in the embodiment of the present disclosure.

As shown in FIGS. 2 and 6-8, the LED device includes two LED chips and any a bracket mentioned above, wherein a first LED chip 61 of the two LED chips is arranged in the first placement zone 121 and a second LED chip 62 of the two LED chips is arranged in the second placement zone 122.

When the first LED chip 61 and the second LED chip 62 are connected in parallel, a first end of the first LED chip 61 and a first end of the second LED chip 62 are respectively in connection with the chip placement layer 12 to further connect with the first electrode 11; and a second end of the first LED chip 61 and a second end of the second LED chip 62 are respectively in connection with the connection layer 22 to further connect with the second electrode 21.

When the first LED chip 61 and the second LED chip 62 are connected in series, a first end of the first LED chip 61 is connected to the chip placement layer 12 to further connect to the first electrode 11; then a second end of the first LED chip 61 is connected with a first end of the second LED chip 62; and then a second end of the second LED chip 62 is connected to the connection layer 22 to further connect to the second electrode 21.

In this embodiment, since the chip placement layer 12 of the bracket is designed to have a larger area by reducing the area of the second insulation trench 32 between the chip placement layer 12 and the connection layer 22, the bracket can accommodate an LED chip with a larger light-emitting area so as to improve the luminance of the LED device. Besides, since the first insulation trench 31 of the bracket between the first electrode 11 and the second electrode 21 is configured to be identical in width and area to those in the prior art, the bracket can be prevented from short-circuiting when the LED device employing the bracket is externally connected, and the bracket can also be compatible with the electrodes of the existing bracket.

Preferably, the LED device further includes a Zener diode 7, which is provided on the connection layer 22, wherein a first end of the Zener diode 7 is connected to the connection layer 22 to further connect to the second electrode 21, while a second end of the Zener diode 7 is connected to the chip placement layer 12 to further connect to the first electrode 11. In this manner, the LED device is prevented from reverse breakdown.

When an LED device employs a bracket having a first reflector cup and a second reflector cup described in the embodiment above, the LED device includes two LED chips, which are arranged in the first placement zone and the second placement zone, respectively. Further, the second groove is filled with a second white light-reflecting layer, and a fluorescent layer is coated on an inner side of the first reflector cup, on the two LED chips, and on the second white light-reflecting layer.

Further, an LED device employing the bracket shown in FIG. 3 is taken as an example to describe such a type of LED devices in detail.

Figure 9:
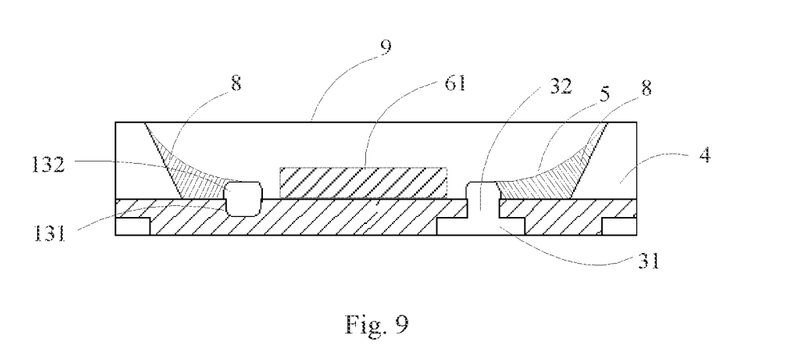
FIG. 9 is a sectional view of an LED device employing the bracket shown in FIG. 3 along the section line B1-B2.

As shown in FIGS. 3, 7 and 9, the LED device includes two LED chips and a bracket having a first reflector cup and a second reflector cup 4. The two LED chips are arranged in a first receiving section 1211 and a second receiving section 1221 of the bracket, respectively. A second white light-reflecting layer 8 is filled in a second groove 5 between the first reflector cup and the second reflector cup 4. As a result, the light emitted by the two LED chips may be reflected towards the light-emitting direction of the LED device, thereby improving the luminous intensity and luminous efficiency of the LED device. In addition, a fluorescent layer 9 is coated on an inner side of the first reflector cup, on both LED chips and on the second white light-reflecting layer 8.

Preferably, since the first reflector cup is square, semi-circle, or dome-shaped at the top, there is a height difference of 60 μm-120 μm between the top of the first reflector cup and the top of the first photo-etched metal part, and the second reflector cup 4 is higher than that of the first reflector cup, the second white light-reflecting layer 8 filled in the second groove 5 has a concave-down arcuate surface, thereby increasing the reflecting area of the LED device to further improve the reflectivity of the LED device.

For embodiments of the LED devices in the present disclosure, the relevant contents can be referred to the embodiments of the brackets, since the LED devices are produced on the basis of the brackets described above. The embodiments of the LED devices described above are merely illustrative, which may be understood and implemented by those skilled in the art, without involving any inventive effort.

What has been described above is merely preferred embodiments of the present disclosure and is not intended to be limiting in any way. For this reason, any simple modification, equivalent change and modification to the above embodiments according to the technical spirit of the present disclosure still fall within the scope of the technical solution of the present disclosure, without departing from the contents of the technical solution of the present disclosure.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'include', 'including'. 'comprise' or 'comprising' do not exclude other steps or elements.

The invention claimed is:

1. A bracket, comprising
    a first photo-etched metal part, composed of a first electrode and a chip placement layer stacked thereon, wherein an area of the chip placement layer is greater than that of the first electrode;
    a second photo-etched metal part, composed of a second electrode and a connection layer stacked thereon;
    wherein a first insulation trench is provided between the first electrode and the second electrode, and a second insolation trench is provided between the chip placement layer and the connection layer,
        wherein the chip placement layer comprises a first placement zone and a second placement zone connected to each other; the first placement zone has a greater length than that of the second placement zone; a first end of the first placement zone is flush with a first end of the second place zone so as to become a first edge of the chip placement layer; and a second end of the first placement zone and a second end of the second placement zone become a second edge of said chip placement layer; and wherein the chip placement layer has a greater length and a greater width than those of the first electrode; and wherein a profile of a first edge of the connection layer is matched with a profile of the second edge of the chip placement layer, second edge of the chip placement layer, wherein the second insulation trench is filled with a first white light-reflecting layer;

a first receiving section is provided at the second end of the first placement zone and a second receiving section is provided at the second end of the second placement zone; the first receiving section and the second receiving section are incorporated in an unaligned manner to jointly form a chip receiving zone; and a reflective wall is provided around the chip receiving zone along a whole periphery, except an edge next to the second insulation trench; and the reflective wall is connected with the first white light-reflecting layer in the second insulation trench to form a first reflector cup.

2. The bracket of claim 1, wherein a first groove is provided around two parallel edges of the chip receiving zone and an edge thereof remote from the second insulation trench, and is filled with a first white light-reflecting layer to form the reflective wall.

3. The bracket of claim 1, wherein the first receiving section comprises a first protruding part, provided at one end of the first receiving section adjacent to the second insulation trench; and the second receiving section comprises a second protruding part, provided at one end of the second receiving section remote from the second insulation trench.

4. The bracket according to claim 1, wherein a second reflector cup is provided around the first photo-etched metal part and the second photo-etched metal part and is located outside of the first reflector cup; and a second groove is formed between the first reflector cup and the second reflector cup for filling with a second white light-reflecting layer.

5. The bracket of claim 2, wherein a second reflector cup is provided around the first photo-etched metal part and the second photo-etched metal part and is located outside of the first reflector cup; and a second groove is formed between the first reflector cup and the second reflector cup for filling with a second white light-reflecting layer.

6. The bracket of claim 3, wherein a second reflector cup is provided around the first photo-etched metal part and the second photo-etched metal part and is located outside of the first reflector cup; and a second groove is formed between the first reflector cup and the second reflector cup for filling with a second white light-reflecting layer.

7. The bracket of claim 4, wherein a top of the first reflector cup is square, semi-circle or dome-shaped, and there is a height difference of 60 μm~120 μm between the top of the first reflector cup and a top of the first photo-etched metal part.

8. The bracket according to claim 1, wherein the second end of the first placement zone is smoothly connected with the second end of the second placement zone at a corner.

9. The bracket of claim 2, wherein the second end of the first placement zone is smoothly connected with the second end of the second placement zone at a corner.

10. The bracket of claim 3, wherein the second end of the first placement zone is smoothly connected with the second end of the second placement zone at a corner.

11. The bracket according to claim 1, wherein the connection layer at its first edge is provided with a third protruding part matched with the second edge of the chip placement layer, so that a Zener diode is placed at such end of the connection layer.

12. The bracket of claim 2, wherein the connection layer at its first edge is provided with a third protruding part matched with the second edge of the chip placement layer, so that a Zener diode is placed at such end of the connection layer.

13. The bracket of claim 3, wherein the connection layer at its first edge is provided with a third protruding part matched with the second edge of the chip placement layer, so that a Zener diode is placed at such end of the connection layer.

14. The bracket of claim 11, wherein the chip placement layer further comprises a Zener connection layer, which is provided between the first reflector cup and the second reflector cup and is close to the third protruding part.

15. The LED device, comprising two LED chips and the bracket according to claim 4, wherein the two LED chips are arranged in the first receiving section and the second receiving section, respectively; a second white light-reflecting layer is filled in a second groove; a fluorescent layer is coated on an inner side of the first reflector cup and on the second white light-reflecting layer.

16. The LED device according to claim 15, wherein a top of the first reflector cup is square, semi-circle or dome-shaped, and there is a height difference of 60 μm~120 μm between the top of the first reflector cup and a top of the first photo-etched metal part.

* * * * *